United States Patent
Chou

(10) Patent No.: US 6,262,919 B1
(45) Date of Patent: Jul. 17, 2001

(54) PIN TO PIN LASER SIGNATURE CIRCUIT

(75) Inventor: Min-Chung Chou, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days.

(21) Appl. No.: 09/544,248

(22) Filed: Apr. 5, 2000

(51) Int. Cl.[7] ........................................ G11C 7/00
(52) U.S. Cl. .................. 365/189.03; 365/195; 365/201; 365/225.7; 327/525
(58) Field of Search .............................. 365/225.7, 201, 365/189.03, 195; 327/525, 526; 324/550

(56) References Cited

U.S. PATENT DOCUMENTS

| | | | |
|---|---|---|---|
| 5,051,691 | * 9/1991 | Wang | 324/550 |
| 5,309,394 | * 5/1994 | Wuertz et al. | 365/189.03 |
| 5,818,285 | * 10/1998 | Lee et al. | 327/525 |
| 6,154,388 | * 11/2000 | Oh | 365/225.7 |

* cited by examiner

Primary Examiner—Son Mai
(74) Attorney, Agent, or Firm—Baker Botts L.L.P.

(57) ABSTRACT

A laser signature circuit in a memory device comprises input pins for input signal into the memory device; internal circuits of the memory device connected to the input pins; a laser signature circuit connected between the internal circuits, wherein the laser signature circuit comprises a fuse to identify the memory device, the fuse is tested by input a signal into a first input pin of the input pins and the signal is measured on a second input pin of the input pins which is not necessary adjacent to the first input pin.

11 Claims, 2 Drawing Sheets

US 6,262,919 B1

PIN TO PIN LASER SIGNATURE CIRCUIT

FIELD OF THE INVENTION

The present invention relates to a testing circuit between input pins to test the fuse between in, more specifically, to a testing circuit between input pins in a memory device to signature the status of the memory device.

BACKGROUND OF THE INVENTION

Semiconductor memories generally include a multitude of memory cells arranged in rows and columns. Each memory cell is capable of storing digital information in the form of a "1" or a "0" bit. To write (i.e., store) a bit into a memory cell, a binary memory address having portions identifying the cell's row (the "row address") and column (the "column address") is provided to addressing circuitry in the semiconductor memory to activate the cell, and the bit is then supplied to the cell. Similarly, to read (i.e., retrieve) a bit from a memory cell, the cell is again activated using the cell's memory address, and the bit is then output from the cell.

Semiconductor memories are typically tested after they are fabricated to determine if they contain any failing memory cells (i.e., cells to which bits cannot be dependably written or from which bits cannot be dependably read). Generally, when a semiconductor memory is found to contain failing memory cells, an attempt is made to repair the memory by replacing the failing memory cells with redundant memory cells provided in redundant rows or columns in the memory.

Conventionally, when a redundant row is used to repair a semiconductor memory containing a failing memory cell, the failing cell's row address is permanently stored (typically in pre-decoded form) on a chip on which the semiconductor memory is fabricated by programming a non-volatile element (e.g., a group of fuses, anti-fuses, or FLASH memory cells) on the chip. Then, during normal operation of the semiconductor memory, if the memory's addressing circuitry receives a memory address including a row address that corresponds to the row address stored on the chip, redundant circuitry in the memory causes a redundant memory cell in the redundant row to be accessed instead of the memory cell identified by the received memory address. Since every memory cell in the failing cell's row has the same row address, every cell in the failing cell's row, both operative and failing, is replaced by a redundant memory cell in the redundant row.

Similarly, when a redundant column is used to repair the semiconductor memory, the failing cell's column address is permanently stored (typically in pre-decoded form) on the chip by programming a non-volatile element on the chip. Then, during normal operation of the semiconductor memory, if the memory's addressing circuitry receives a memory address including a column address that corresponds to the column address stored on the chip, redundant circuitry in the memory causes a redundant memory cell in the redundant column to be accessed instead of the memory cell identified by the received memory address. Since every memory cell in the failing cell's column has the same column address, every cell in the failing cell's column, both operative and failing, is replaced by a redundant memory cell in the redundant column.

From the discussion of semiconductor memories thus far, it may appear that such memories comprise one large array of memory cells. This is true as far as other electronic devices are concerned, because such devices typically interact with a semiconductor memory as if it were a single array of memory cells arranged in as many rows and columns (referred to as "global" rows and columns) as are uniquely addressable by the memory's row and column addresses.

For the reliability improvement, it is necessary to identify whether the burn-in fail devices and the customer return devices are repaired devices or not. However, after assembly, the break of the laser fuse cannot be observed visually. Therefore, it is required that the repaired memory device can be identified electrically. A laser signature circuit is normally used for this purpose.

A laser signature circuit in a memory device comprises a fuse. When the fuse in a failing cell is broken by using laser technology, the fuse in the laser signature circuit of the failing device is broken at the same time. Accordingly, the status of the memory device is determined by using the fuse in the laser signature circuit.

Referring to FIG. 1, it is mentioned that a memory circuit comprises a laser signature circuit in accordance with prior art, electrostatic-discharge (ESD) protective devices are connected to an input pin and an internal circuit of the memory circuit.

Still referring to FIG. 1, a signal is input from an input pin 100 of a memory device for accessing or storing data into an internal circuit 200. The input pin 100 is connected to the internal circuit 200. Additionally, several electrostatic-discharge (ESD) devices 130 and several clamping devices 130 are connected to the input pin 100 and the internal circuit 200. The ESD device 130 consists of thick gate n-channel metal-oxide-semiconductor (MOS) transistors (field oxide devices) for limiting the electrostatic-discharge (ESD) pulse inputting from the input pin 100. The laser signature circuit consists of a fuse 110 and several diodes 120. In detail, a terminal of the laser signature circuit is connected to the input pin 100 and the internal circuit 200, the other terminal of the laser signature circuit is the power pin $V_{DD}$. The $V_T$ (threshold voltage) of the thick gate MOS transistor 130 is normally much higher than twice of the $V_T$ of the thin gate MOS transistor in the laser signature circuit 120.

When the memory cells of the internal circuit 200 are repaired by laser technology, the fuse 110 is melted (i.e. opened) by using laser light. As operator wants to identify whether the memory cells of the internal circuit 200 are repaired, the fuse 110 is tested by applying a voltage on the input pin 100. The applied voltage is higher than $V_{DD}$ (power supply voltage) plus twice of the threshold voltage of the thin gate MOS transistor, and is lower than $V_{DD}$ plus threshold voltage of the thick gate MOS transistor. The current on the input pin 100 is then measured. If the fuse 110 has not been broken by the laser, the current on the input pin 100 can be detected and that means that the memory devices in the internal circuit 200 are not repaired.

Nevertheless, as the shallow-trench-isolation (STI) technique is adapted to fabricate the isolation regions between the active regions in deep submicron semiconductor devices the conducting of the thick gate n-channel MOS transistor (a field oxide device) occurs at a voltage (at input pin 100) higher than the breakdown voltage of the gate oxide of the thin gate oxide MOS transistors in the internal circuit 200. Consequently, the ESD devices 130 must consist of thin gate MOS transistors. The use of thin gate oxide device as ESD device 130 also serve as clamping device to reduce the overshot and undershot noise at the input pin 100. However, in this case the laser signature circuit no longer work, because device 130 becomes conducting at lower input voltage (at input pin 100) than that of the device 120 in the laser signature circuit.

It is needed that a laser signature circuit is connected to input pins of a memory device for identifying the status of the memory cells in the memory device and it is useful when thin gate ESD devices are connected to the input pins for limiting the electrostatic-discharge pulse occurred on the input pins.

SUMMARY OF THE INVENTION

The present invention provides a laser signature circuit in a memory device, comprises: a plurality of input pins for inputting signal into the memory device; a plurality of internal circuits of the memory device connected to the plurality of input pins; a laser signature circuit connected between the plurality of internal circuits, wherein the laser signature circuit comprises a fuse to identify the memory device, the fuse is tested by inputting a signal into a first input pin of the plurality of input pins and the signal is measured on a second input pin of the plurality of input pins.

A method to determine the short of a laser signature circuit in a memory device, comprises: inputting a voltage into a first input pin of the memory device; measuring a current on a second input pin of the memory device to determine the laser signature circuit whether or not is short and the memory device whether or not is repaired, wherein the laser signature is connected between the first input pin and the second input pin.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PRESENT INVENTION

The present invention discloses a laser signature circuit consisting of a fuse and at least one diode. Meanwhile, the laser signature circuit is connected between two input pins of a memory device for identify whether or not the memory cells in the memory devices are repaired by laser light. Moreover, the method to detect the fuse in the laser signature circuit is to first apply a high voltage on a first input pin and detect the current on a second input pin. If the current on the second input pin can be detected, the fuse between two input pins is short that means the memory cells in the memory device with the laser signature circuit having the fuse are not repaired by laser light. In detail, the laser signature circuit is connected between two input pins of a memory device.

Figure 1:
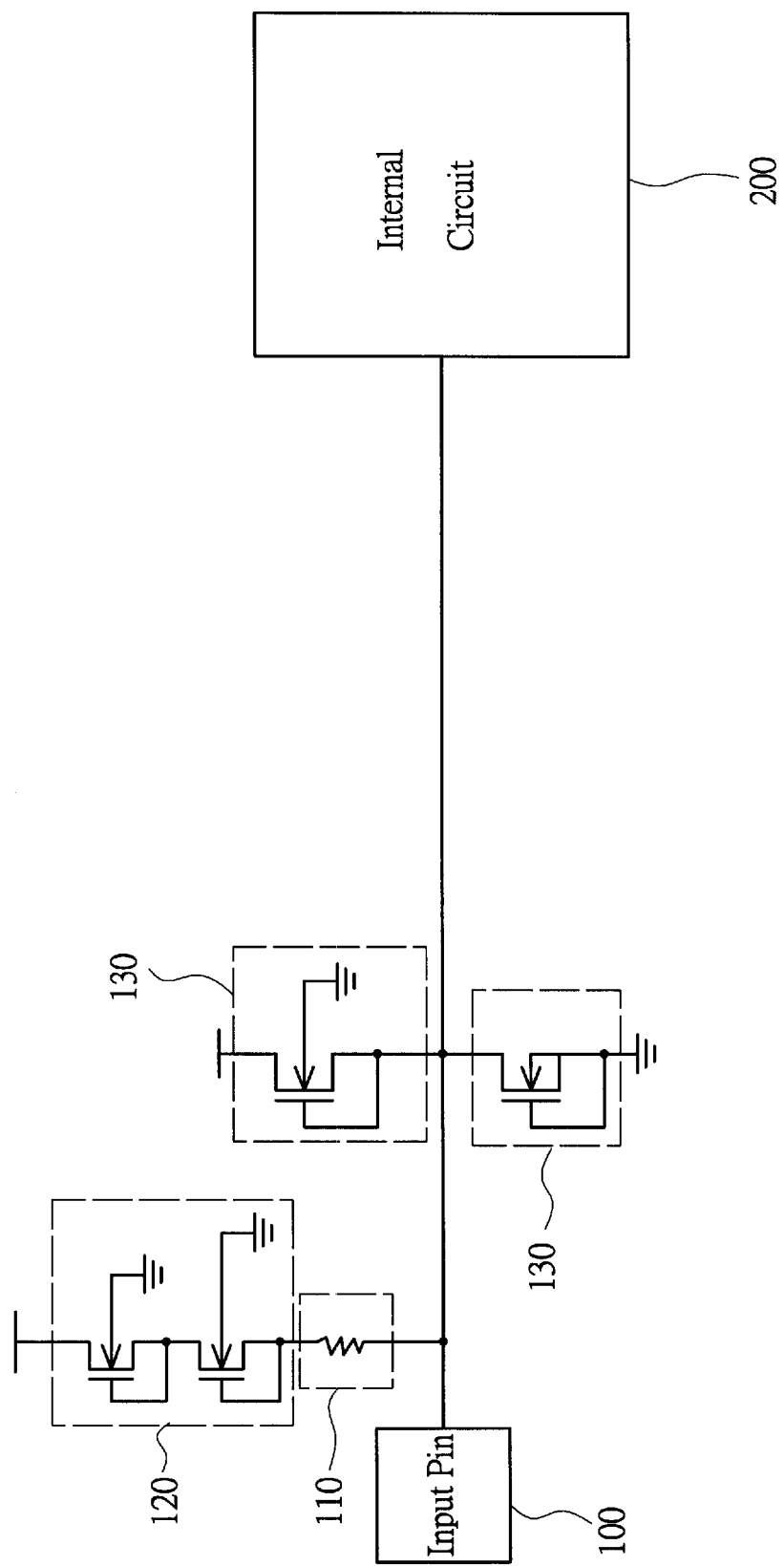
FIG. 1 shows a schematic diagram of a circuit, which has an internal circuit of a memory device, the thick gate ESD devices, a laser signature fuse and an input pin in accordance with prior art.
Figure 2:
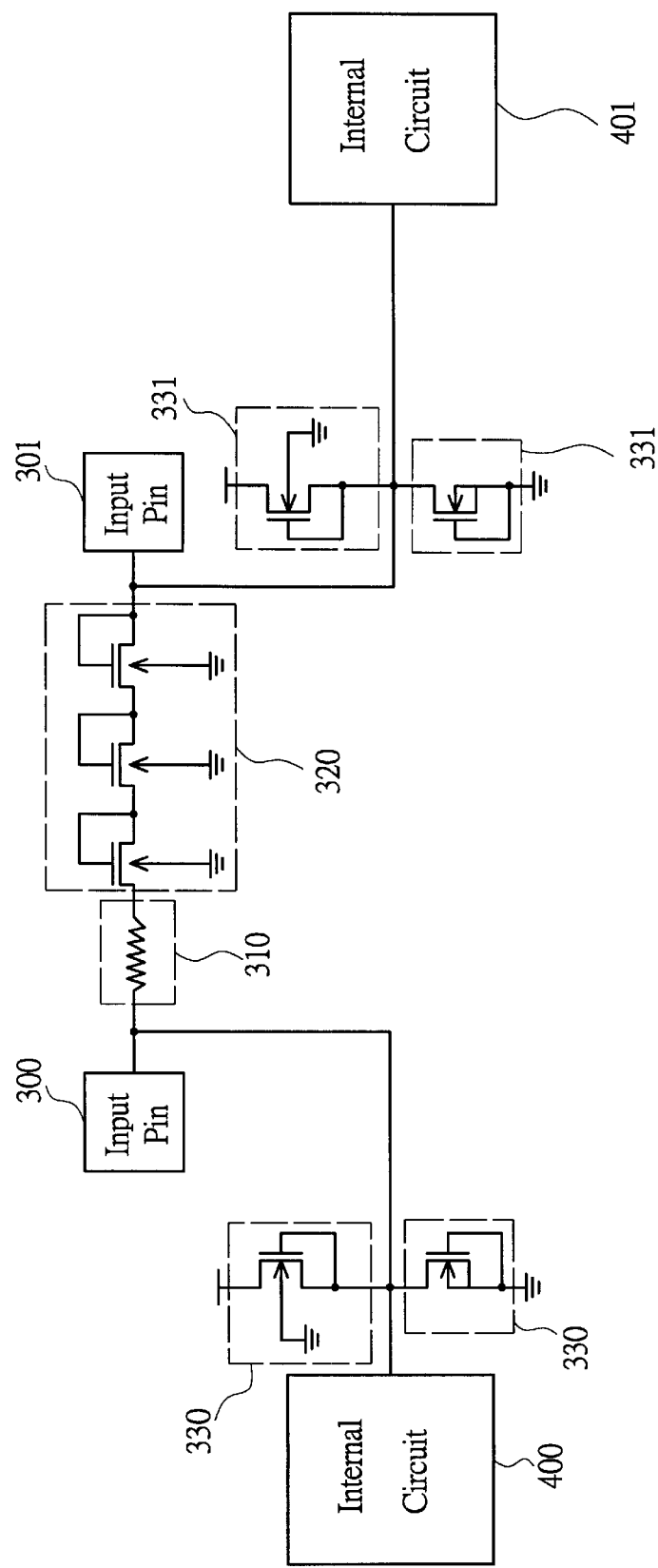
FIG. 2 shows a schematic diagram of a circuit, which has a laser signature circuit that is coupled between two pins in the memory device in accordance with the present invention.

Referring to FIG. 2, a schematic diagram of a memory circuit with a laser signature circuit between two input pins of the memory circuit is shown. The memory circuit has several internal circuits and memory cells are built therein. In the preferred embodiment of the present invention, two internal circuits, that are indicated as an internal circuit 400 and an internal circuit 401 in FIG. 2, are mentioned for the detail description of the present invention. According to the common technology to design memory devices, the number of the internal circuits in a memory device is not only two.

The internal circuit 400 is connected to an input pin 300 for inputting signal. Moreover, the internal circuit 400 is protected by electrostatic-discharge (ESD) protective devices and clamping devices 330. The ESD protective devices 330 can be implement by one MOS transistor or several parallel MOS transistors. The ESD protective devices 330 discharge the high-voltage pulse that input from the input pin 300 and reduce the noise inputting from the input pin 300. Meanwhile, the ESD protective devices 330 are connected to the internal circuit 400 and the input pin 300 for the protection of the internal circuit 400. In a preferred embodiment of the present invention, the ESD protective devices 330 consist of thin gate ESD protective devices 330. Nevertheless, the ESD protective devices 330 are not limited to the thin gate ESD protective devices, which are only a preferred embodiment of the present invention.

Simultaneously, the internal circuit 401 is connected to an input pin 301 and is protected by ESD protective devices 331.

In a memory device, the internal circuit 400 with protective devices may be similar to the internal circuit 401 with protective devices. In a preferred embodiment of the present invention, the memory device is indicated as a dynamic-random-access memory (DRAM) device, but not to limited to this kind of the memory device.

A laser signature circuit is connected between the input pins 300 and 301. In detail, the laser signature circuit consists of a fuse 310 and at least one diode 320. Moreover, the fuse 310 and at least one diode 320 are connected in serial. The at least one diode 320 in a laser signature circuit is served as one directional conducting device in the laser signature circuit to make sure that a high voltage is applied on an input pin and the current can be detected on another input pin, wherein the laser signature circuit is connected between these two input pins.

As the memory cells in the internal circuits 400 and 401 are repaired by using laser technology to break the fuses in the memory cells, the fuse 310 is melt for open the fuse 310 to identify the status of these memory cells. When operators want to know whether or not the memory cells are repaired by laser light or the memory cells in the internal circuits of a memory device is failure, the fuse 310 is tested for detecting the status of the memory cells. In other words, the fuse 310 is open means that the memory cells in the internal circuits connected to the laser signature circuit having the fuse 310 have been repaired.

The present invention also discloses a method to determine the short of a laser signature circuit in a memory device. A voltage is first input into a first input pin 301 of the memory device and a current on a second input pin 300 of the memory device are then measured to determine the laser signature circuit whether or not is short and the memory device whether or not is repaired. Meanwhile, the laser signature circuit is connected between the first input pin and the second input pin.

While the preferred embodiment of the invention has been illustrated and described, it will be appreciated that various changes can be made therein without departing from the spirit and scope of the invention.

What is claimed is:

1. A method to determine a short of a laser signature circuit in a memory device, comprises:

inputting a voltage into a first input pin of said memory device; and measuring a current on a second input pin of said memory device to determine said laser signature circuit whether or not is short and said memory device whether or not is repaired, wherein said laser signature circuit is connected between said first input pin and said second input pin.

2. The method according to claim 1, wherein each of said first input pin and said second input pin is connected to at least one electrostatic-discharge (ESD) device for protecting electrostatic discharge from said input pins.

3. The method according to claim 2, wherein said at least one electrostatic-discharge (ESD) device comprises a thin-gate electrostatic-discharge (ESD) device.

4. The method according to claim 1, wherein each of said first input pin and said second input pin is connected to at least one clamping circuit for clamping noise input from said plurality of input pins.

5. The method according to claim 1, wherein said laser signature circuit comprises at least one one-directional conducting device.

6. If The method according to claim 5, wherein said at least one-directional conducting device comprises a diode.

7. A method for testing a fuse to identify a laser signature circuit in a memory device, wherein said laser signature circuit comprises a fuse coupled between two input pins of said memory device, comprising:

inputting a signal into an input pin of said input pins; and measuring the signal on the other pin of said input pins.

8. The method according to claim 7, wherein each of said input pins is connected to at least one electrostatic-discharge (ESD) device for protecting electrostatic discharge from said input pins.

9. The method according to claim 8, wherein said at least one electrostatic-discharge (ESD) device comprises a thin-gate electrostatic-discharge (ESD) device.

10. The method according to claim 7, wherein said laser signature circuit comprises at least one one-directional conducting device connected between said input pins and said fuse.

11. The method according to claim 10, wherein said at least one-directional conducting device comprises a diode.

* * * * *